(12) United States Patent  
Li et al.

(10) Patent No.: US 8,145,442 B2  
(45) Date of Patent: Mar. 27, 2012

(54) FAST AND ACCURATE ESTIMATION OF GATE OUTPUT LOADING

(75) Inventors: Hong Li, Sunnyvale, CA (US); Li Ding, San Jose, CA (US); Alireza Kasnavi, Sunnyvale, CA (US)

(73) Assignee: Synopsys, Inc., Mountain View, CA (US)

( * ) Notice: Subject to any disclaimer, the term of this patent is extended or adjusted under 35 U.S.C. 154(b) by 422 days.

(21) Appl. No.: 12/363,373

(22) Filed: Jan. 30, 2009

(65) Prior Publication Data

US 2010/0198539 A1 Aug. 5, 2010

(51) Int. Cl.  
*G01R 27/26* (2006.01)  
*G06F 17/40* (2006.01)

(52) U.S. Cl. ............... 702/65; 702/57; 702/69; 327/365

(58) Field of Classification Search ............... 702/65, 702/57, 69  
See application file for complete search history.

(56) References Cited

U.S. PATENT DOCUMENTS

| | | | |
|---|---|---|---|
| 5,519,338 A * | 5/1996 | Campbell et al. | 326/27 |
| 6,040,717 A * | 3/2000 | Fried | 326/113 |
| 2009/0193373 A1* | 7/2009 | Abbaspour et al. | 716/6 |

* cited by examiner

*Primary Examiner* — Hal Wachsman  
(74) *Attorney, Agent, or Firm* — Park, Vaughan, Fleming & Dowler LLP

(57) ABSTRACT

Embodiments of a computer system, a method, an integrated circuit and a computer-program product (i.e., software) for use with the computer system are described. These devices and techniques may be used to analyze an electrical characteristic of a logic gate electrically coupled to an output network in a stage. In particular, during the analysis, the effective capacitance of an output network coupled to a logic gate is approximated as a function of a total resistance of the output network, a total capacitance of the output network, and a geometric parameter of the output network. Using the effective capacitance and other parameters, such as a slew rate of an electrical signal applied to an input of the logic gate, an electrical characteristic of the logic gate, such as an input capacitance, is determined.

24 Claims, 5 Drawing Sheets

FIG. 6

Ceff 610-1 | Ceff 610-2 | ...

RATIO 612-1 | VALUE 614-1 | RATIO 612-2 | VALUE 614-2
RATIO 612-3 | VALUE 614-3 | ...

FIG. 7

Cin 710-1 | Cin 710-2 | ...

Ceff 712-1 | SLEW RATE 714-1 | VALUE 716-1 | Ceff 712-2
SLEW RATE 714-2 | VALUE 716-2 | ...

FAST AND ACCURATE ESTIMATION OF GATE OUTPUT LOADING

BACKGROUND

1. Field of the Invention

Embodiments of the present invention relate to circuit simulators and analysis of circuits. More specifically, embodiments of the present invention relate to a technique for estimating an output load on a logic gate.

2. Related Art

In circuit simulations or timing analysis, one or more electrical characteristics of a logic gate may be a function of its output load. For example, the delay of a stage that includes a driver and a receiver is a function of the input capacitance of the receiver gate, which in turn is a function of the effective capacitance (Ceff) at the output of the receiver gate. Consequently, the delay of the logic gate can be accurately modeled if Ceff is accurately determined.

However, determining Ceff accurately typically involves detailed calculations based on the poles and zeros associated with interconnect parasitics using iterative computation techniques, which are time-consuming.

In an attempt to address this problem, existing circuit simulation software includes approximations for Ceff. For example, zero and a total capacitance (Ctotal) for the output load are used to define minimum and maximum values of Ceff in circuit simulations. However, these extremum values often result in simulated delays that are, respectively, too pessimistic or too optimistic (i.e., too large or too small).

Hence, there is a need for a simulation technique that approximates Ceff without the above-described problems.

SUMMARY

One embodiment of this invention provides a computer system for analyzing an electrical characteristic of a logic gate electrically coupled to an output network in a stage. During the analysis, the computer system calculates an effective capacitance for the output network, where the effective capacitance corresponds to: the total resistance of the output network, the total capacitance of the output network, and a geometric parameter of the output network. Then, the computer system determines the electrical characteristic of the logic gate based at least in part on the effective capacitance and a slew rate of an electrical signal applied to the logic gate.

Note that the electrical characteristic may include: an input capacitance of the logic gate, alignment of cross-talk signals, delay of the stage up to the logic gate and/or slew associated with the stage up to the logic gate.

Furthermore, the total resistance may be a summation of resistances in the output network; the total capacitance may be a summation of capacitances in the output network; and the geometric parameter may include a fanout count of the output network. More generally, the geometric parameter may include topological information of the output network, such as a number of branches in the output network. Therefore, in some embodiments calculating the effective capacitance involves calculating and combining effective capacitances for different branches in the output network, where the effective capacitance of a given branch corresponds to the total resistance of the given branch, the total capacitance of the given branch, and a geometric parameter of the given branch.

Moreover, the effective capacitance may correspond to a ratio of the product of the total resistance and the total capacitance divided by the geometric parameter. In some embodiments, the effective capacitance is calculated using a piecewise linear relationship between extremum values of the effective capacitance as a function of the ratio.

Additionally, determining the electrical characteristic may involve performing a look-up in a predetermined table of values of the electrical characteristic as a function of the effective capacitance and other parameters, for example, the slew rate at the input of the logic gate.

In some embodiments, the computer system performs the calculating and determining operation to a group of series-coupled stages to calculate a path delay of the group of stages.

Another embodiment provides a method for analyzing the electrical characteristic of the logic gate, which may be performed by the computer system. This method may include at least some of the preceding operations.

Another embodiment provides a computer-program product for use in conjunction with the computer system. This computer-program product may include instructions corresponding to at least some of the preceding operations.

Another embodiment provides an integrated circuit to analyze the electrical characteristic of the logic gate. This circuit may be configured to perform at least some of the preceding operations.

BRIEF DESCRIPTION OF THE FIGURES

FIG. 6 is a block diagram illustrating a data structure in accordance with an embodiment of the present invention.

FIG. 7 is a block diagram illustrating a data structure in accordance with an embodiment of the present invention.

Note that like reference numerals refer to corresponding parts throughout the drawings.

DETAILED DESCRIPTION

The following description is presented to enable any person skilled in the art to make and use the invention, and is provided in the context of a particular application and its requirements. Various modifications to the disclosed embodiments will be readily apparent to those skilled in the art, and the general principles defined herein may be applied to other embodiments and applications without departing from the spirit and scope of the present invention. Thus, the present invention is not intended to be limited to the embodiments shown, but is to be accorded the widest scope consistent with the principles and features disclosed herein.

Embodiments of a computer system, a method, an integrated circuit and a computer-program product (i.e., software) for use with the computer system are described. These devices and techniques may be used to analyze an electrical characteristic of a logic gate electrically coupled to an output network in a stage. In particular, during the analysis, the effective capacitance (Ceff) of an output network coupled to a logic gate is approximated as a function of a total resistance of the output network, a total capacitance of the output network, and a geometric parameter of the output network. For example, Ceff may be approximated as a function of a ratio of the product of the total resistance and the total capacitance to the fanout count of the output network. Using Ceff and other parameters, such as a slew rate of an electrical signal applied to an input of the logic gate, an electrical characteristic of the logic gate, such as an input capacitance, is determined.

Moreover, determining an accurate approximation for Ceff using this analysis technique may be less time-consuming than existing analysis techniques. In addition, this analysis technique models Ceff as a function of easily obtained interconnect parameters. In this way, this analysis technique may provide faster and more accurate simulations of the electrical characteristic and timing analysis for the logic gate.

Figure 1:
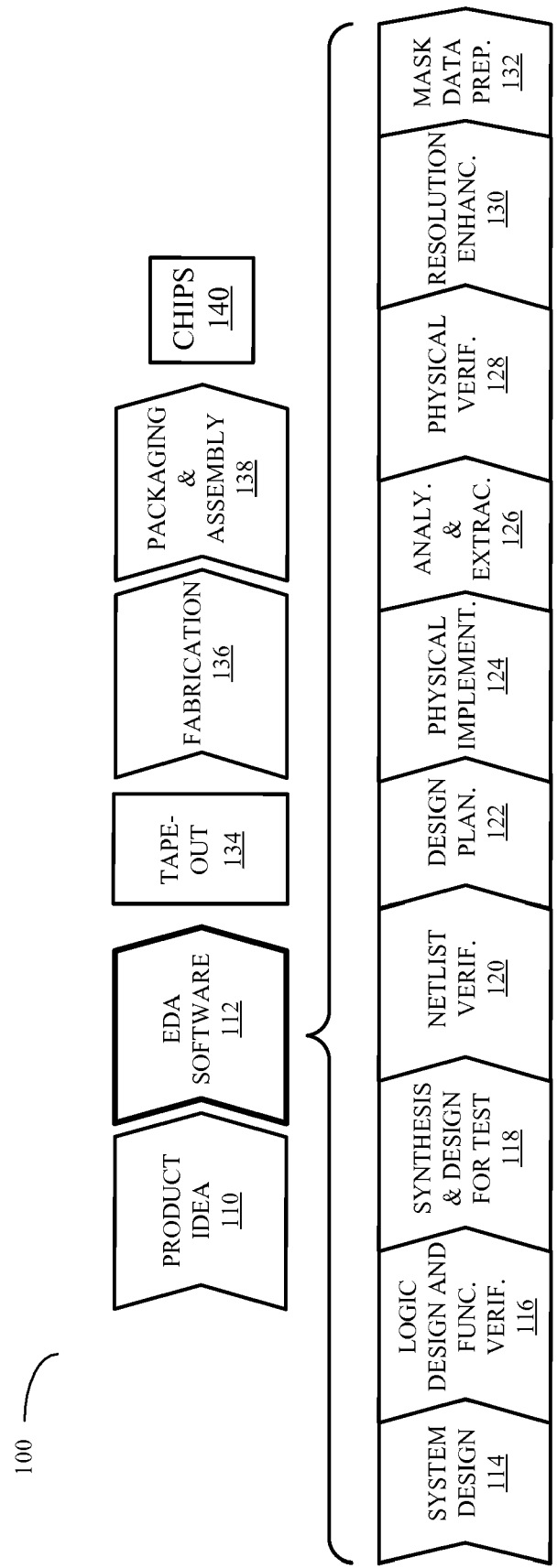
FIG. 1 is flowchart illustrating various operations in the design and fabrication of an integrated circuit in accordance with an embodiment of the present invention.

We now describe embodiments of design and fabrication of integrated circuits or chips. FIG. 1 is flowchart 100 illustrating the various operations in the design and fabrication of an integrated circuit. This process starts with the generation of a product idea (110), which is realized during a design process that uses electronic design automation (EDA) software (112). When the design is finalized, it can be taped-out (134). After tape-out, a semiconductor die is fabricated (136) and packaging and assembly processes (138) are performed, which ultimately result in finished chips (140).

Note that the design process that uses EDA software (112) includes operations 114-132, which are described below. This design flow description is for illustration purposes only. In particular, this description is not meant to limit the present invention. For example, an actual integrated circuit design may require a designer to perform the design operations in a different sequence than the sequence described herein.

During system design (114), designers describe the functionality to implement. They can also perform what-if planning to refine the functionality and to check costs. Note that hardware-software architecture partitioning can occur at this stage.

Then, during logic design and functional verification (116), VHDL or Verilog code for modules in the circuit is written and the design is checked for functional accuracy. More specifically, the design is checked to ensure that it produces the correct outputs.

Next, during synthesis and design for test (118), VHDL/Verilog is translated to a netlist. This netlist can be optimized for the target technology. Additionally, tests can be designed and implemented to check the finished chips.

Moreover, during netlist verification (120), the netlist is checked for compliance with timing constraints and for correspondence with the VHDL/Verilog source code.

Furthermore, during design planning (122), an overall floor plan for the chip is constructed and analyzed for timing and top-level routing.

Additionally, during physical implementation (124), the placement (positioning of circuit elements) and routing (connection of the same) occurs.

Then, during analysis and extraction (126), the circuit function is verified at a transistor level, which permits refinement.

Next, during physical verification (128), the design is checked to ensure correctness for: manufacturing, electrical issues, lithographic issues, and circuitry.

Moreover, during resolution enhancement (130), geometric manipulations of the layout are performed to improve manufacturability of the design.

Additionally, during mask-data preparation (132), the 'tape-out' data for production of masks to produce finished chips is provided.

Embodiments of the present invention can be used during one or more of the above-described stages. Specifically, in some embodiments the present invention can be used during system design (114) and/or logic design and functional verification (116).

Figure 2A:
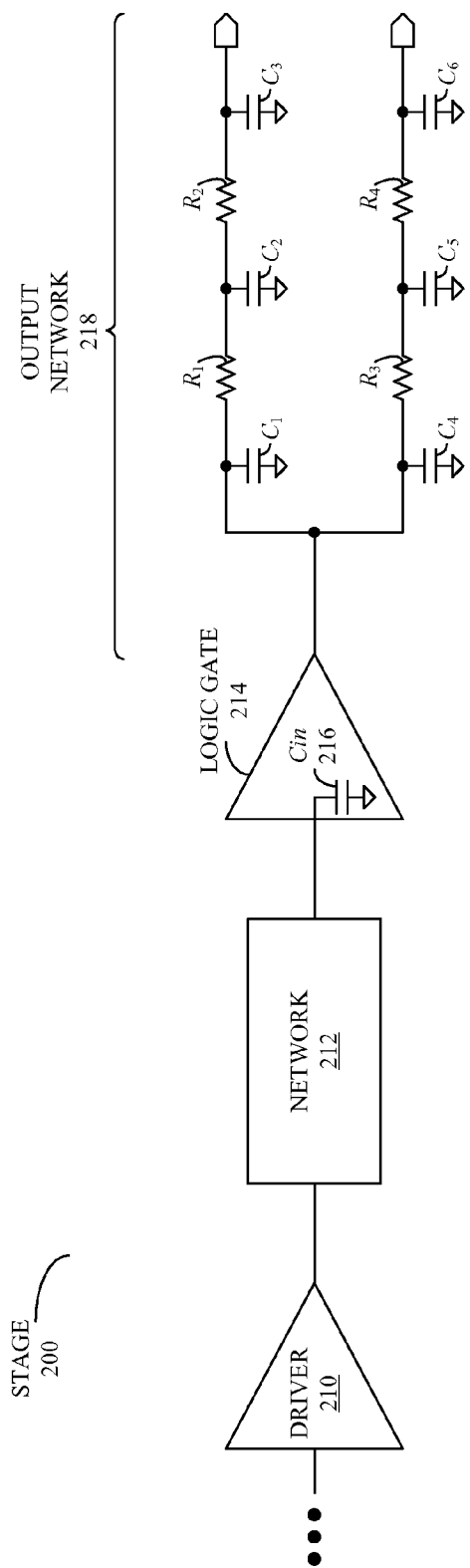
FIG. 2A is a block diagram illustrating a logic gate electrically coupled to an output network in a stage in accordance with an embodiment of the present invention.

We now describe embodiments of a technique for analyzing or computing an electrical characteristic of a logic gate. FIG. 2A presents a block diagram illustrating stage 200, which includes: a driver 210 electrically coupled to a network 212, which in turn is electrically coupled to logic gate 214 (which is often referred to as a receiver gate). For example, logic gate 214 may be a NAND or a NOR gate in an analog circuit, a digital circuit or a mixed signal circuit. More generally, logic gate 214 may include a gate with one or more transistors.

Figure 2B:
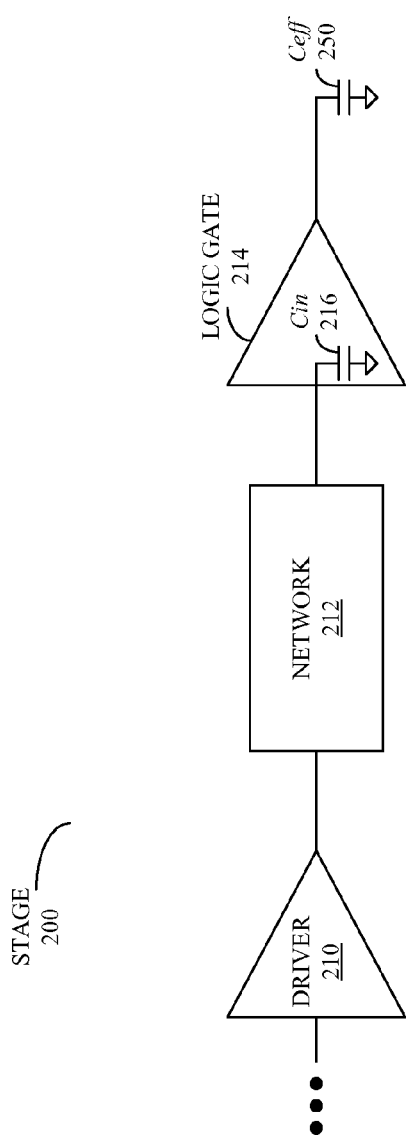
FIG. 2B is a block diagram illustrating the stage of FIG. 2A with an approximation for the output network in accordance with an embodiment of the present invention.

Logic gate 214 is electrically coupled to output network 218. As noted previously, an electrical characteristic of logic gate 214, such as input capacitance (Cin) 216, is a function of the output network 218, and in particular, of Ceff. This is shown in FIG. 2B, which illustrates stage 200 with output network 218 (FIG. 2A) approximated using Ceff 250. Note that Cin 216 is also a function of the slew rate at the input of logic gate 214.

In the discussion that follows, an approximation to Ceff 250 is described. This approximation represents an effective compromise between computational speed, and timing and signal-integrity accuracy, which facilitates accurate determination of one or more electrical characteristics of logic gate 214.

Figure 3:
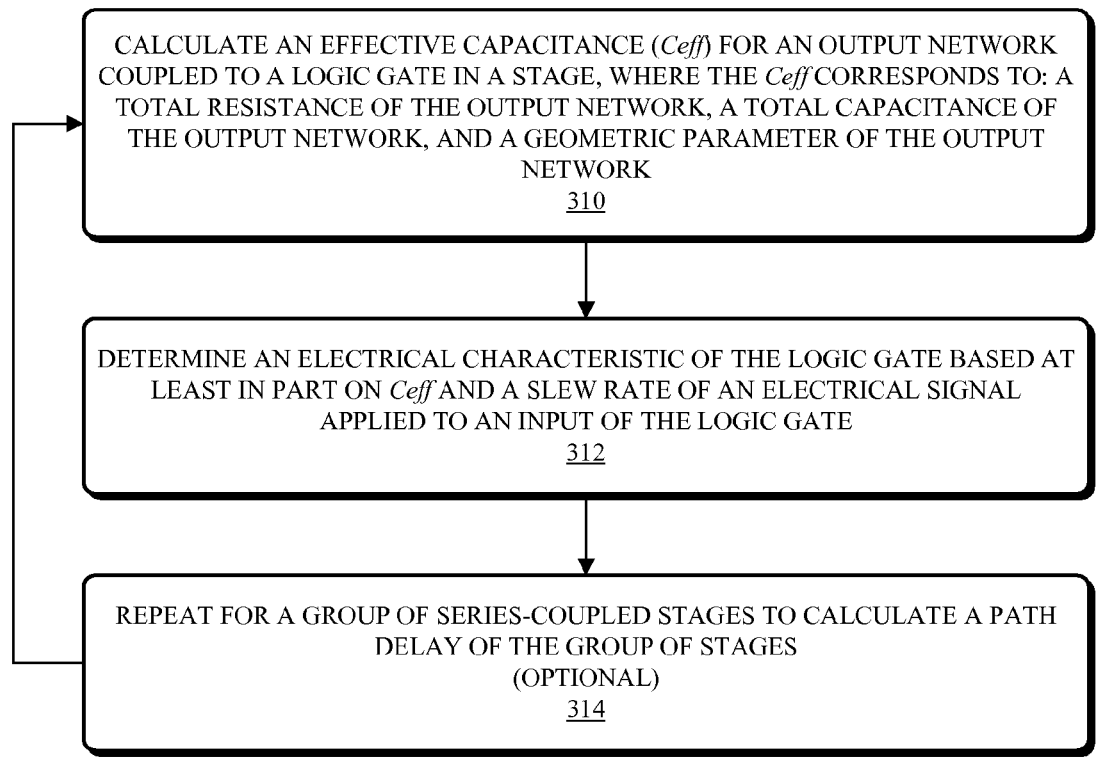
FIG. 3 is a flowchart illustrating a method for analyzing an electrical characteristic of a logic gate in accordance with an embodiment of the present invention.

FIG. 3 presents a flowchart illustrating a method 300 for analyzing or computing an electrical characteristic of logic gate 214 in stage 200 in FIGS. 2A and 2B, which may be performed by a computer system. During the analysis, the computer system calculates Ceff 250 for output network 218 (310), where Ceff 250 corresponds to: the total resistance of output network 218, the total capacitance of output network 218, and a geometric parameter of output network 218. Then, the computer system determines the electrical characteristic of logic gate 214 based at least in part on Ceff 250 and a slew rate of an electrical signal applied to the input of logic gate 214 (312).

In some embodiments, the computer system optionally performs the calculating and determining operation to a group of series-coupled stages to calculate a path delay of the group of stages (314).

Note that in some embodiments of method 300 there may be additional or fewer operations. Moreover, the order of the operations may be changed and/or two or more operations may be combined into a single operation.

In an exemplary embodiment, the electrical characteristic includes Cin 216 of logic gate 214, and Ceff 250 may correspond to a ratio of the product of the total resistance and the total capacitance divided by the geometric parameter (e.g., Ceff 250 may be a function of the ratio). In particular, the total resistance may be a summation of resistances in output network 218 (e.g., $R_1+R_2+R_3+R_4$); the total capacitance may be a summation of capacitances (e.g., $C_1+C_2+C_3+C_4+C_5+C_6$) in output network 218; and the geometric parameter may include a fanout count of output network 218 (or a number of pin counts in output network 218). Note that the total resistance may model the first-order resistive shielding effect in output network 218, and the fanout count may model the effect of parallel wire segments. Also note that each of the parameters in the ratio may be available during circuit simulations without traversing the entire output network 218 or complicated iterative calculations, which makes this approximation to Ceff 250 computationally efficient.

In other embodiments, the ratio may be generalized. For example, the geometric parameter may include topological information of output network 218. Therefore, in some embodiments calculating Ceff 250 involves calculating and combining effective capacitances for different branches in output network 218, where the effective capacitance of a given branch corresponds to the total resistance of the given branch, the total capacitance of the given branch, and a geometric parameter of the given branch.

Figure 4:
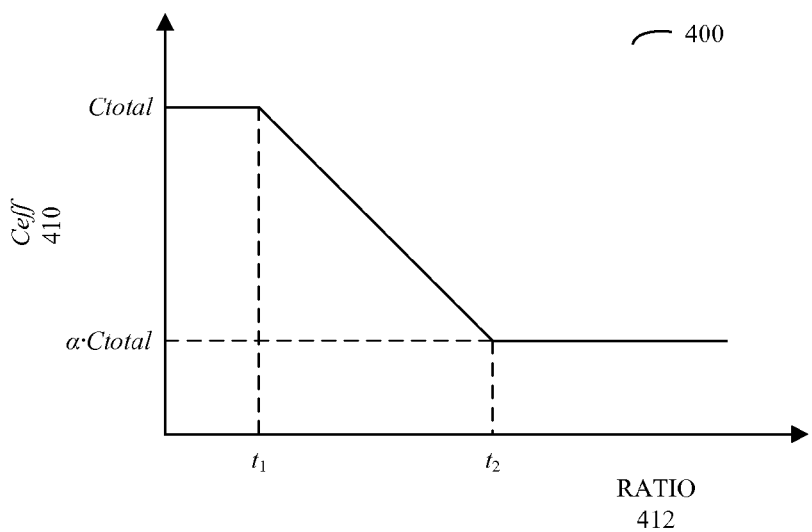
FIG. 4 is a graph illustrating effective capacitance of a logic gate as a function of the product of a total resistance of an output network and a total capacitance of the output network divided by a fanout count of the output network in accordance with an embodiment of the present invention.

In some embodiments, Ceff 250 is expressed as a closed-form function of these parameters. Alternatively or additionally, Ceff 250 may be calculated using a piecewise linear relationship between extremum values of Ceff 250 as a function of the ratio. This is shown in FIG. 4, which presents a graph 400 illustrating Ceff 410 as a function of ratio 412 (i.e., the ratio of the product of the total resistance and the total capacitance to the fanout count). Curve parameters $t_1$, $t_2$ and $\alpha$ can be obtained by curve fitting graph 400. For example, for a 65-nm process, $\alpha$ may be between 0.1 and 0.4, $t_1$ may be between 0 and 15 ps (such as 10 ps), and $t_2$ may be between 50 and 200 ps (such as 120 ps). Note that graph 400 may be an average curve that is determined using measurements and/or simulations performed on multiple stages, such as stage 200.

Using the approximation for Ceff 250, the electrical characteristic of logic gate 214 may be determined. For example, Cin 216 may be determined by performing a look-up in a predetermined table of values of the electrical characteristic as a function of Ceff 250 and the slew rate. In turn, using Cin 216, additional electrical characteristics, such as a delay of stage 200, may be determined accurately and quickly. While Ceff 250 can be estimated with a 10-15% accuracy using this analysis technique, 90% of the corresponding delay estimates may have an accuracy of 0.5% (i.e., are within 0.5% of delay estimates made using values of Ceff 250 that are determined using more comprehensive calculation techniques). Note that using Ceff 410 equal to Ctotal may result in the minimum delay in stage 200, while using Ceff 410 equal to a Ctotal may result in the maximum delay.

Figure 5:
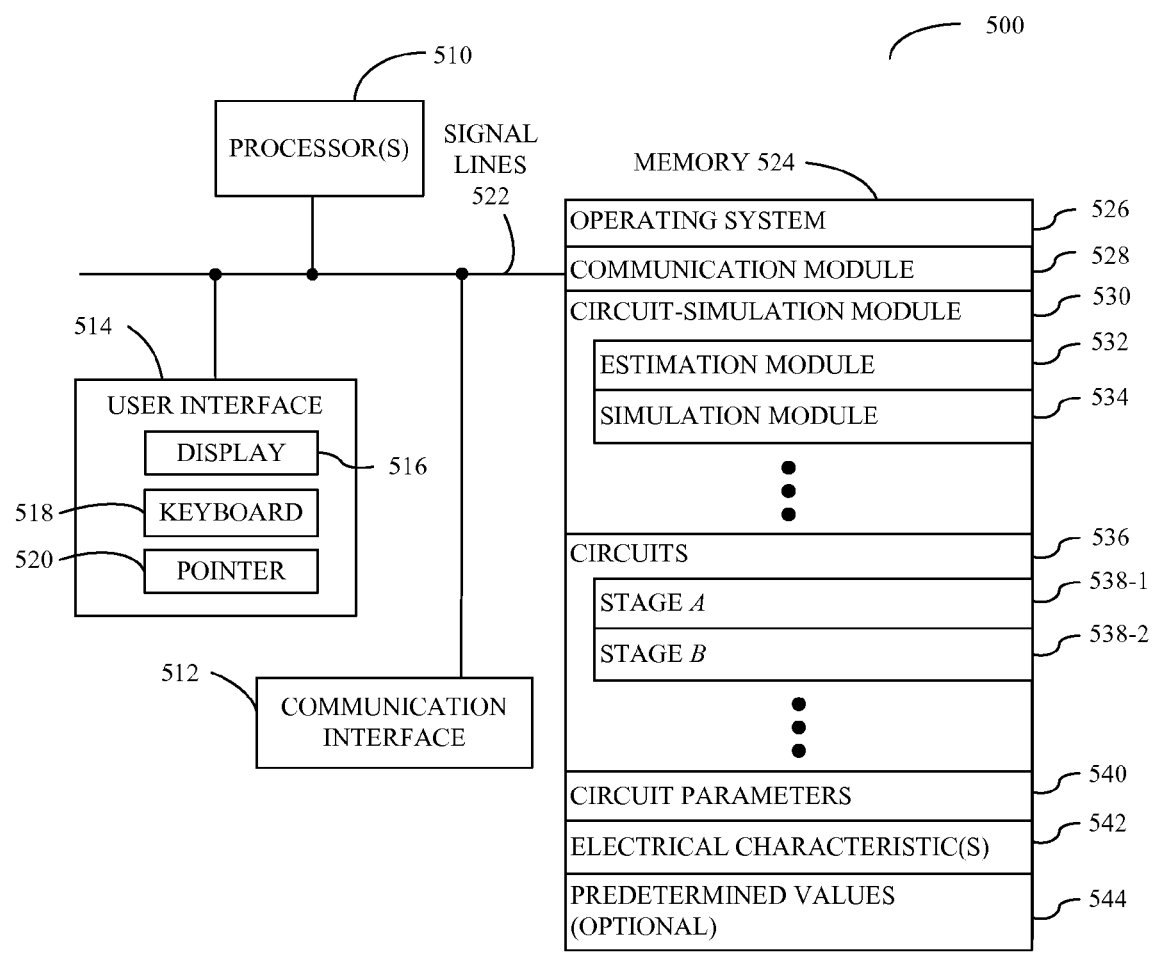
FIG. 5 is a block diagram illustrating a computer system that analyzes an electrical characteristic of a logic gate in accordance with an embodiment of the present invention.

We now describe embodiments of a computer system that analyzes the electrical characteristic of the logic gate. FIG. 5 presents a block diagram illustrating a computer system 500. Computer system 500 includes: one or more processors 510, a communication interface 512, a user interface 514, and one or more signal lines 522 coupling these components together. Note that the one or more processing units 510 may support parallel processing and/or multi-threaded operation, the communication interface 512 may have a persistent communication connection, and the one or more signal lines 522 may constitute a communication bus. Moreover, the user interface 514 may include: a display 516, a keyboard 518, and/or a pointer 520, such as a mouse.

Memory 524 in the computer system 500 may include volatile memory and/or non-volatile memory. More specifically, memory 524 may include: ROM, RAM, EPROM, EEPROM, flash, one or more smart cards, one or more magnetic disc storage devices, and/or one or more optical storage devices. Memory 524 may store an operating system 526 that includes procedures (or a set of instructions) for handling various basic system services for performing hardware-dependent tasks. Memory 524 may also store procedures (or a set of instructions) in a communication module 528. These communication procedures may be used for communicating with one or more computers and/or servers, including computers and/or servers that are remotely located with respect to the computer system 500.

Memory 524 may also include multiple program modules (or sets of instructions), including circuit-simulation module 530 (or a set of instructions). Moreover, circuit-simulation module 530 may include: estimation module 532 (or a set of instructions) and/or simulation module 534 (or a set of instructions).

Estimation module 532 may estimate electrical characteristics 542 (such as Cin 216 and/or Ceff 250 in FIG. 2B) for one or more circuits 536 (or portions of these circuits), such as stage A 538-1 and stage B 538-2. For example, Ceff 250 (FIG. 2B) may be estimated using circuit parameters 540. Additionally or separately, Cin 216 (FIG. 2B) may be estimated using optional predetermined values 544 of Ceff 250 (FIG. 2B) and a slew rate of electrical signals. Using estimated electrical characteristics 542, simulator module 534 may perform analysis or simulations of one or more of circuits 536 (or portions of these circuits).

Instructions in the various modules in the memory 524 may be implemented in: a high-level procedural language, an object-oriented programming language, and/or in an assembly or machine language. Note that the programming language may be compiled or interpreted, e.g., configurable or configured, to be executed by the one or more processing units 510.

Computer system 500 may include a variety of devices, such as: a personal computer, a laptop computer, a server, a work station, a main-frame computer, and/or other device capable of manipulating computer-readable data.

Although the computer system 500 is illustrated as having a number of discrete items, FIG. 5 is intended to be a functional description of the various features that may be present in the computer system 500 rather than a structural schematic of the embodiments described herein. In practice, and as recognized by those of ordinary skill in the art, the functions of the computer system 500 may be distributed over a large number of servers or computers, with various groups of the servers or computers performing particular subsets of the functions. Consequently, computer system 500 may be at one location or may be distributed across multiple locations, such as computing systems that communicate via a network (such as the Internet or an intranet).

In some embodiments, some or all of the functionality of the computer system 500 may be implemented in one or more application-specific integrated circuit (ASICs), field-programmable gate array (FPGAs), and/or one or more digital signal processors (DSPs). Thus, circuit analysis or simulations may be performed using an FPGA.

Computer system 500 may include fewer components or additional components. Moreover, two or more components may be combined into a single component and/or a position of one or more components may be changed. In some embodiments, the functionality of the computer system 500 may be implemented more in hardware and less in software, or less in hardware and more in software, as is known in the art.

We now discuss embodiments of data structures that may be used in the computer system 500. FIG. 6 presents a block diagram illustrating a data structure 600. This data structure may include Ceff 610 tables. For example, Ceff 610-1 table may include multiple pairs of ratios 612 and values 614 for Ceff.

FIG. 7 presents a block diagram illustrating a data structure 700. This data structure may include Cin 710 tables. For example, Cin 710-1 table may include multiple groups of Ceff 712, slew rates 714 and values 716 for Cin.

In some embodiments, stage 200 (FIGS. 2A and 2B), computer system 500 (FIG. 5), data structures 600 (FIG. 6) and/or 700 include fewer or additional components. Moreover, two or more components may be combined into a single component and/or a position of one or more components may be changed.

While Cin 216 (FIG. 2A) of logic gate 214 (FIG. 2A) was used as an illustrative example of the electrical characteristic, in other embodiments the electrical characteristic may include: alignment of cross-talk signals, delay of stage 200 (FIG. 2A) up to logic gate 214 (FIG. 2A), routing information and/or slew associated with stage 200 (FIG. 2A) up to logic gate 214 (FIG. 2A).

The foregoing descriptions of embodiments of the present invention have been presented for purposes of illustration and description only. They are not intended to be exhaustive or to limit the present invention to the forms disclosed. Accordingly, many modifications and variations will be apparent to practitioners skilled in the art. Additionally, the above disclosure is not intended to limit the present invention. The scope of the present invention is defined by the appended claims.

What is claimed is:

1. A method for analyzing an electrical characteristic of a logic gate electrically coupled to an output network in a stage, comprising:
    calculating an effective capacitance for the output network in the stage, wherein the effective capacitance corresponds to the total resistance of the output network, the total capacitance of the output network, and a geometric parameter of the output network; and
    determining the electrical characteristic of the logic gate using the effective capacitance and a slew rate of an electrical signal applied to the logic gate.

2. The method of claim 1, wherein the electrical characteristic includes an input capacitance of the logic gate.

3. The method of claim 1, wherein the total resistance is a summation of resistances in the output network.

4. The method of claim 1, wherein the total capacitance is a summation of capacitances in the output network.

5. The method of claim 1, wherein the geometric parameter includes a fanout count of the output network.

6. The method of claim 1, wherein the geometric parameter includes topological information of the output network.

7. The method of claim 1, wherein calculating the effective capacitance involves calculating and combining effective capacitances for different branches in the output network; and
    wherein the effective capacitance of a given branch corresponds to the total resistance of the given branch, the total capacitance of the given branch, and a geometric parameter of the given branch.

8. The method of claim 1, wherein the effective capacitance corresponds to the ratio of the product of the total resistance and the total capacitance divided by the geometric parameter.

9. The method of claim 8, wherein the effective capacitance is calculated using a piecewise linear relationship between extremum values of the effective capacitance as a function of the ratio.

10. The method of claim 1, wherein the electrical characteristic includes alignment of cross-talk signals.

11. The method of claim 1, wherein the electrical characteristic includes delay of the stage up to the logic gate.

12. The method of claim 1, wherein the electrical characteristic includes slew associated with the stage up to the logic gate.

13. The method of claim 1, further comprising performing the calculating and determining operation to a group of series-coupled stages to calculate a path delay of the group of stages.

14. The method of claim 1, wherein determining the electrical characteristic involves performing a look-up in a predetermined table of values of the electrical characteristic as a function of the effective capacitance and the slew rate.

15. A non-transitory computer-readable storage medium storing instructions that, when executed by a computer, causes the computer to perform a method to analyze an electrical characteristic of a logic gate electrically coupled to an output network in a stage, the instructions including:
    instructions for calculating an effective capacitance for the output network in the stage, wherein the effective capacitance corresponds to the total resistance of the output network, the total capacitance of the output network, and a geometric parameter of the output network; and
    instructions for determining the electrical characteristic of the logic gate using the effective capacitance and a slew rate of an electrical signal applied to the logic gate.

16. The non-transitory computer-readable storage medium of claim 15, wherein the electrical characteristic includes an input capacitance of the logic gate.

17. The non-transitory computer-readable storage medium of claim 15, wherein the total resistance is a summation of resistances in the output network.

18. The non-transitory computer-readable storage medium of claim 15, wherein the total capacitance is a summation of capacitances in the output network.

19. The non-transitory computer-readable storage medium of claim 15, wherein the geometric parameter includes a fanout count of the output network.

20. The non-transitory computer-readable storage medium of claim 15, wherein the geometric parameter includes topological information of the output network.

21. The non-transitory computer-readable storage medium of claim 15, wherein calculating the effective capacitance involves calculating and combining effective capacitances for different branches in the output network; and
    wherein the effective capacitance of a given branch corresponds to the total resistance of the given branch, the total capacitance of the given branch, and a geometric parameter of the given branch.

22. The non-transitory computer-readable storage medium of claim 15, wherein the effective capacitance corresponds to the ratio of the product of the total resistance and the total capacitance divided by the geometric parameter.

23. The non-transitory computer-readable storage medium of claim 22, wherein the effective capacitance is calculated using a piecewise linear relationship between extremum values of the effective capacitance as a function of the ratio.

24. A computer system, comprising:
    a processor;
    memory;

a program module, wherein the program module is stored in the memory and configured to be executed by the processor to analyze an electrical characteristic of a logic gate electrically coupled to an output network in a stage, the program module including:

instructions for calculating an effective capacitance for the output network in the stage, wherein the effective capacitance corresponds to the total resistance of the output network, the total capacitance of the output network, and a geometric parameter of the output network; and instructions for determining the electrical characteristic of the logic gate using the effective capacitance and a slew rate of an electrical signal applied to the logic gate.

* * * * *